United States Patent
Burt et al.

(10) Patent No.: US 7,292,095 B2
(45) Date of Patent: Nov. 6, 2007

(54) NOTCH FILTER FOR RIPPLE REDUCTION IN CHOPPER STABILIZED AMPLIFIERS

(75) Inventors: Rodney T. Burt, Tucson, AZ (US); Joy Y. Zhang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 98 days.

(21) Appl. No.: 11/340,223

(22) Filed: Jan. 26, 2006

(65) Prior Publication Data

US 2007/0170981 A1    Jul. 26, 2007

(51) Int. Cl.
*H03F 1/02*    (2006.01)

(52) U.S. Cl. ............................................ 330/9; 330/69

(58) Field of Classification Search .................... 330/9, 330/69, 310, 98, 150, 252, 260; 327/124, 327/307

See application file for complete search history.

(56) References Cited

U.S. PATENT DOCUMENTS 5,382,956 A * 1/1995 Baumgartner et al. ...... 341/155
5,663,680 A * 9/1997 Nordeng ........................ 330/9
7,132,883 B2 * 11/2006 Huijsing et al. ................ 330/9
7,202,738 B1 * 4/2007 Huijsing et al. ............ 330/253

OTHER PUBLICATIONS

"Circuit Techniques for Reducing the Effects of Op-Amp Imperfections: Autozeroing, Correlated Double Sampling, and Chopper Stabilization" by Christian C. Enz and Gabor C. Temes, Proceeding of the IEEE, vol. 84, No. 11, Nov. 1996, pp. 1584-1614.

* cited by examiner

*Primary Examiner*—Henry Choe
(74) *Attorney, Agent, or Firm*—Wade J. Brady, III; Frederick J. Telecky, Jr.

(57) ABSTRACT

A chopper-stabilized amplifier receiving an input signal includes a first operational transconductance amplifier having an input chopper and an output chopper for chopping an output signal produced by the first operational transconductance amplifier. A switched capacitor notch filter filters the chopped output signal by operating synchronously with the chopping frequency of output chopper to filter ripple voltages that otherwise would be produced by the output chopper. In one embodiment, a second operational transconductance amplifier amplifies the notch filter output. The input signal is fed forward, summed with the output of the second operational transconductance amplifier, and applied to the input of a fourth operational transconductance amplifier. Ripple noise and offset are substantially reduced.

20 Claims, 3 Drawing Sheets

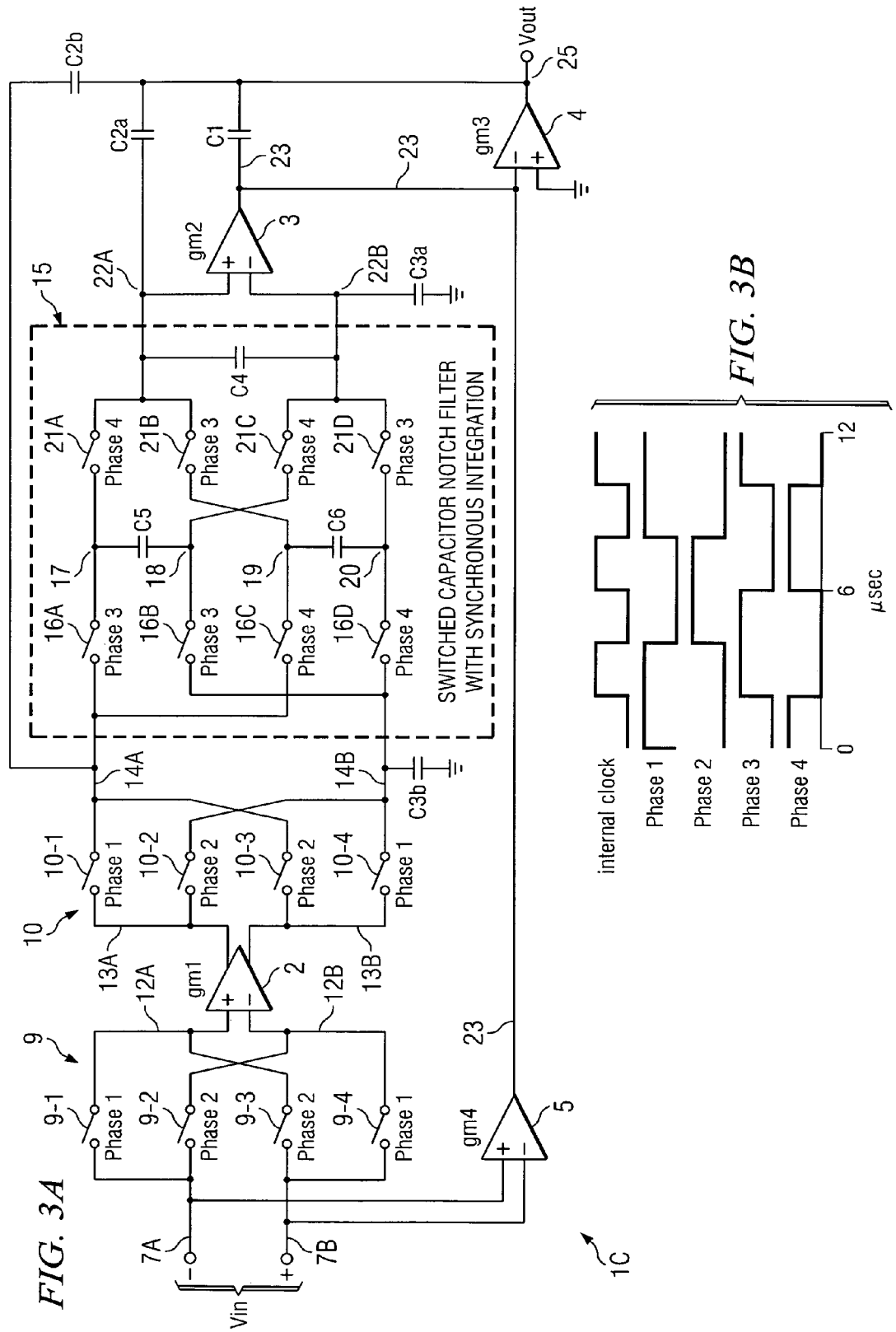

NOTCH FILTER FOR RIPPLE REDUCTION IN CHOPPER STABILIZED AMPLIFIERS

BACKGROUND OF THE INVENTION

The present invention relates generally to reducing chopping noise, also referred to as ripple noise, in chopper stabilized operational amplifiers, and more particularly to using switched capacitor notch filters to reduce ripple noise.

It is highly desirable that integrated circuit operational amplifiers have low offset voltage, low noise, low-offset drift, and good signal stability. Chopper stabilization and auto-zeroing are two common techniques that have been widely used to reduce amplifier offset voltage and drift. (For example, conventional chopper stabilization would typically reduce a 5 millivolt offset voltage to roughly 5 microvolts.) Modern chopper-stabilized operational amplifiers and autozero operational amplifiers have significantly reduced, or even essentially eliminated, the amount switching noise therein compared to previous designs. However, the improved design techniques used in modern chopper-stabilized operational amplifiers and auto-zero operational amplifiers result in trade-offs between input referred noise and quiescent supply current (Iq). The inherent trade offs between basic chopper-stabilized amplifiers and autozero amplifiers are well known. While the auto-zeroing method provides low ripple noise at the amplifier output, its in-band noise is high due to aliasing or noise folding. On the other hand, the chopper stabilization technique presents lower in-band noise due to absence of noise folding, but its output ripple noise is relatively higher. Basic chopper-stabilized amplifiers maintain the broadband noise characteristics of their input stages, but "shift" their input offset voltages up to the chopping frequency, creating large ripple voltages at the amplifier outputs. Although basic autozero amplifiers do not shift their input offset to their autozero frequency like chopper-stabilized amplifiers, they suffer from aliasing or folding back of their broadband noise spectrums during their zeroing cycles, which increases the overall input referred noise of the amplifiers.

It can be shown that for an ideal input stage, the square of the input referred noise is inversely proportional to the quiescent supply current Iq of the amplifier, which causes the basic autozero amplifiers to have significantly increased quiescent supply current Iq in order to achieve the desired noise levels, including the aliasing or noise folding. This makes it very desirable to use chopper-stabilized amplifiers in micropower applications and to find a way of solving the basic limitation of ripple noise at the chopping frequency.

FIG. 1 shows a conventional basic three-stage amplifier 1A with multipath nested Miller compensation. This circuit configuration can be thought of as including a three-stage high gain signal path including three sequentially coupled stages 2, 3 and 4 having transconductances of gm1, gm2, and gm3, respectively, coupled in parallel with a wider bandwidth two stage signal path including two sequentially coupled stages 5 and 4 having transconductances of gm4 and gm3, respectively. The amount of DC precision of the operational amplifier shown in FIG. 1 is determined by the input stage 2 in the three-stage high gain signal path, while the high frequency response and phase margin are dominated by the two-stage signal path. Proper selection of the transconductances and the compensation capacitances results in the operational amplifier having the bandwidth and settling characteristics of a two-stage Miller compensated operational amplifier with a minimal increase in quiescent supply current Iq being required to achieve a good GBW/Iq (i.e., gain-bandwidth/Iq) ratio.

FIG. 2A shows the basic operational amplifier configuration of FIG. 1 further including basic chopper stabilization circuitry added before and after the input stage 2 in the high gain three-stage DC signal path. The chopper stabilization has the advantage of substantially reducing offset voltage, offset voltage drift with respect to temperature, and flicker noise, but has the disadvantage of shifting the offset voltage of the input stage 2 to the chopping frequency fs and thereby producing a large ripple voltage component in the amplifier output Vout.

There is an unmet need for a chopper-stabilized amplifier having extremely low output ripple noise.

There also is an unmet need for a chopper-stabilized operational amplifier having extremely low output ripple noise and a very low offset voltage.

SUMMARY OF THE INVENTION

It is an object of the invention to provide a chopper-stabilized amplifier having extremely low output ripple noise.

It is another object of the invention to provide a chopper-stabilized operational amplifier having extremely low output ripple noise and a very low offset voltage.

Briefly described, and in accordance with one embodiment, the present invention provides a chopper-stabilized amplifier receiving an input signal (Vin) includes a first operational transconductance (i.e., with a voltage input and a current output) amplifier (2) having an input chopper (9) and an output chopper (10) for chopping an output signal produced by the first operational transconductance amplifier. A switched capacitor notch filter (15) filters the chopped output signal by operating synchronously with the chopping frequency of output chopper to filter ripple voltages that otherwise would be produced by the output chopper. In one embodiment, a second operational transconductance amplifier (3) amplifies the notch filter output. The input signal (Vin) is fed forward, summed with the output of the second operational transconductance amplifier, and applied to the input of a third operational transconductance amplifier or operational amplifier (4). Ripple noise and offset are substantially reduced.

In one embodiment, a chopper-stabilized amplifier (1C) includes a first operational transconductance amplifier (2), first chopper circuitry (9) coupled to an input (12A,B) of the first operational transconductance amplifier (2) for chopping an input signal (Vin) and applying the chopped input signal to the input of the first operational transconductance amplifier (2), and second chopper circuitry (10) coupled to an output (13A,B) of the first operational transconductance amplifier (2) for chopping an output signal produced by the first operational transconductance amplifier (2), and a switched capacitor notch filter (15) having an input coupled to the second chopper circuitry (10) and performing an integrate and transfer function on a chopped output signal produced by the second chopper circuitry (10) synchronously with a chopping frequency of the second chopper circuitry (10) to notch filter ripple voltages that otherwise would occur in an output of the second chopper circuitry (10). The input of the notch filter (15) includes first (14A) and second (14B) input terminals, wherein the notch filter (15) includes first (22A) and second (22B) output terminals.

The notch filter (15) includes a first path including a first switch (16A) coupled between the first input terminal (14A) and a first conductor (17), a second switch (21A) coupled between the first conductor (17) and the first output terminal (22A), a third switch (16B) coupled between the second input terminal (14B) and a second conductor (18), and a fourth switch (21C) coupled between the second conductor (18) and the second output terminal (22B), a second path including a fifth switch (16C) coupled between the first input terminal (14A) and a third conductor (19), a sixth switch (21B) coupled between the third conductor (19) and the first output terminal (22A), a seventh switch (16D) coupled between the second input terminal (14B) and a fourth conductor (20), and an eighth switch (21D) coupled between the fourth conductor (20) and the second output terminal (22B), and a first integrate and transfer capacitor (C5) coupled between the first (17) and second (18) conductors and a second integrate and transfer capacitor (C6) coupled between the third (19) and fourth (20) conductors.

In the described embodiment, the first (16A), third (16B), sixth (21B) and eighth (21D) switches are controlled by a first clock signal (Phase3) and the second (21A), fourth (21C), fifth (16C), and seventh (16D) switches are controlled by a second clock signal (Phase4), wherein the first (Phase3) and second (Phase4) clock signals are out of phase with each other, and wherein transitions of the first (Phase3) and second (Phase4) clock signals are staggered with respect to transitions of a chopping signal of the second chopper circuitry (10). The notch filter (15) operates synchronously with a chopping signal of the second chopper circuitry (10) to cause a current at the input (14A,B) of the notch filter (15) to be integrated onto the first integrate and transfer capacitor (C5) during the first clock signal (Phase3) and onto the second integrate and transfer capacitor (C6) during the second clock signal (Phase4) and to cause charge held on the first integrate and transfer capacitor (C5) to be transferred to the output (22A,B) of the notch filter (15) during the second clock signal (Phase4) and to cause charge held on the second integrate and transfer capacitor (C6) to be transferred to the output (22A,B) of the notch filter (15) during the first clock signal (Phase3). Various compensation capacitance configurations can be coupled on the input side of the notch filter (15) and/or the output side of the notch filter (15). In the described embodiment, the amount of compensation capacitance coupled on the input side of the notch filter (15) is substantially greater than the amount of compensation capacitance coupled on the output side of the notch filter (15) to provide stability and fast signal settling in the chopper-stabilized amplifier (1C).

The switched capacitor notch filter (15) can constitute means receiving the chopped output signal (14A,B) for operating synchronously with the chopping frequency to filter ripple voltages that otherwise would occur in the chopped output signal (14A,B).

In one embodiment, the invention provides a chopper-stabilized amplifier (1C) including a first operational transconductance amplifier (2) first chopper circuitry (9) coupled to an input (12A,B) of the first operational transconductance amplifier (2) for chopping an input signal (Vin) and applying the chopped input signal to the input of the first operational transconductance amplifier (2), and second chopper circuitry (10) coupled to an output (13A,B) of the first operational transconductance amplifier (2) for chopping an output signal produced by the first operational transconductance amplifier (2). A switched capacitor notch filter means (15), with an input coupled to receive the chopped output signal (14A,B), for performing an integrate and transfer function on a chopped output signal produced by the second chopper circuitry (10) synchronously with the chopping frequency to notch filter ripple voltages that otherwise would occur in the chopped output signal (14A,B).

BRIEF DESCRIPTION OF THE DRAWINGS

FIG. 3A is a detailed block diagram of a chopper-stabilized operational amplifier of the present invention including a switched capacitor notch filter with synchronous integration.

FIG. 3B is a timing diagram for one mode of operation of the operational amplifier of FIG. 3A.

DETAILED DESCRIPTION OF THE PREFERRED EMBODIMENTS

Figure 1:
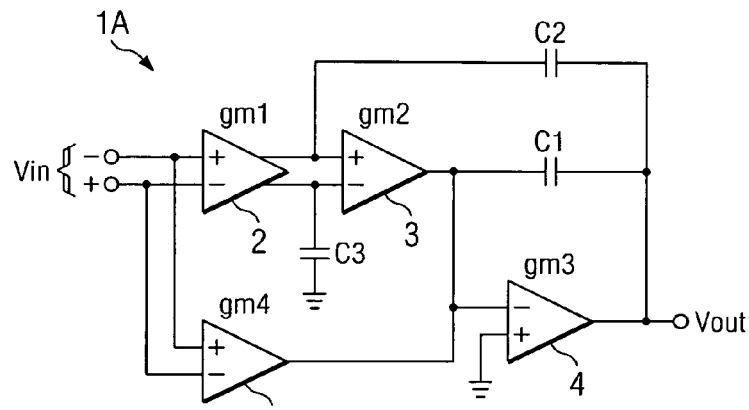
FIG. 1 is block diagram of a prior art three-stage operational amplifier with multi-path nested Miller compensation.

Referring to FIG. 3A, operational amplifier 1C includes (−) input conductor 7A and (+) input conductor 7B by means of which an input signal Vin is applied to input chopping circuitry 9. Chopping circuitry 9 includes switches 9-1 and 9-2 connected to (−) input conductor 7A and switches 9-3 and 9-4 connected to (+) input conductor 7B. Switches 9-1 and 9-3 are connected by conductor 12A to the (+) input of operational transconductance amplifier 2, and switches 9-2 and 9-4 are connected by conductor 12B to the (−) input of operational transconductance amplifier 2. Output conductors 13A and 13B of operational transconductance amplifier 2 are connected to output chopping circuitry 10, which includes switches 10-1 and 10-2 connected to conductor 13A and switches 10-3 and 10-4 connected to conductor 13B. Chopper switches 10-1 and 10-3 are connected to conductor 14A, and chopper switches 10-2 and 10-4 are connected to conductor 14B. The chopped output of operational transconductance amplifier 2 produced between conductors 14A and 14B is applied to the differential inputs of a switched capacitor notch filter 15. Conductor 14B is also connected to one terminal of a compensation capacitor C3b, the other terminal of which is connected to ground. Conductor 14A also is connected to one terminal of a compensation capacitor C2b, the other terminal of which is connected to Vout conductor 25.

Switched capacitor notch filter 15 (which is a low pass filter with notches at the chopping frequency fs and its harmonics) includes switch 16A connected between conductors 14A and 17, switch 16B connected between conductors 14B and 18, switch 16C connected between conductors 14A and 19, and switch 16D connected between conductors 14B and 20. An "integrate and transfer" capacitor C5 is connected between conductors 17 and 18, and another "integrate and transfer" capacitor C6 is connected between conductors 19 and 20. Switched capacitor notch filter 15 also includes switch 21A connected between conductors 17 and 22A, switch 21B connected between conductors 19 and 22A, switch 21C connected between conductors 18 and 22B, and switch 21D connected between conductors 20 and 22B.

Capacitor C4 is connected between output conductors 22A and 22B of notch filter 15. The (+) input conductor 7B of operational amplifier 1C is connected to the (−) input of operational transconductance amplifier 5, the (+) input of which is connected to the (−) input conductor 7A of operational amplifier 1C. The output of a feed-forward operational transconductance amplifier 5 is connected by conductor 23 of the (−) input of operational amplifier 4, which alternatively can be a transconductance operational amplifier. (Capacitor C4 might be optional in some cases, but it has been found to provide somewhat improved charge transfer, somewhat improved filtering and ripple noise reduction, and/or somewhat improved frequency compensation.)

The transconductances of operational transconductance amplifiers 2 and 3, operational amplifier (or transconductance operational amplifier) 4, and transconductance operational amplifier 5 are gm1, gm2, gm3, and gm4, respectively.

Notch filter 15 includes two parallel signal paths, each with switches operating at the same frequency fs as the chopping signals shown in FIG. 3B but with a ¼ period delay. The ¼ period delays allow integrating of the amplified signal and the offset of input operational transconductance amplifier 2 in half the cycle of the chopping frequency. However, it should be noted that the switching frequency of notch filter 15 can be different than the chopping frequency fs. For example, the switching frequency of notch filter 15 can be one half of the chopping frequency fs, with no delay, in which case the amplified signal and the offset and ripple components therein are integrated over an entire chopping frequency cycle.

Notch filter output conductor 22A is connected to the (+) input of operational transconductance amplifier 3 and to one terminal of a compensation capacitor C2a, the other terminal of which is connected to output conductor 25. Notch filter output conductor 22B is connected to the (−) input of operational transconductance amplifier 3 and to one terminal of a compensation capacitor C3a, the other terminal of which is connected to ground. The output of operational transconductance amplifier 3 is connected by conductor 23 to the (−) input of transconductance operational amplifier or operational amplifier 4 (hereinafter referred to as operational amplifier 4), the output of which is connected to output conductor 25 and the (+) input of which is connected to ground. Conductor 23 also is connected to one terminal of compensation capacitor C1, the other terminal of which is connected to output conductor 25.

Figure 3C:
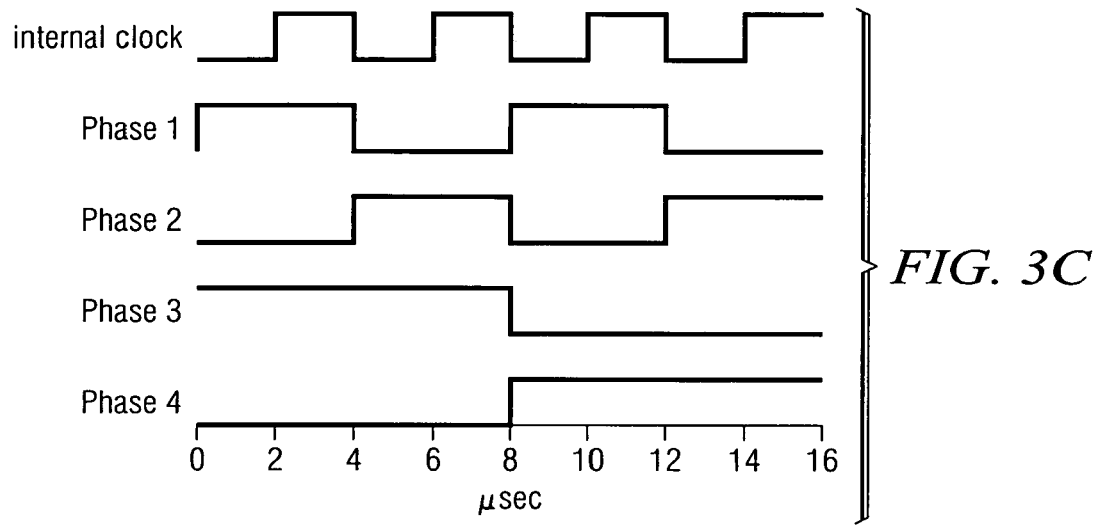
FIG. 3C is a timing diagram for another mode of operation of the operational amplifier of FIG. 3A.

The two timing diagrams shown in FIG. 3B and FIG. 3C, respectively, each illustrate four synchronized clock signals Phase1, Phase2, Phase3, and Phase4 which can be used to control the various chopping switches and filter switches as shown in FIG. 3A. Phase1 controls chopping switches 9-1, 9-4, 10-1, and 10-4, and Phase2 controls chopping switches 9-2, 9-3, 10-2, and 10-3. Phase3 controls notch filter switches 16A, 16B, 21B, and 21D, and Phase4 controls switches 16C, 16D, 21A and 21C. The Phase1 and Phase2 chopping signals are the same in FIGS. 3B and 3C. In FIG. 3B the Phase3 and Phase4 notch filter clocking signals operate at the same frequency fs as the chopping signals Phase1 and Phase2 but are 90 degrees out of phase with them. However, in FIG. 3C the Phase3 and Phase4 notch filter clocking signals operate at half the chopping frequency, i.e. at fs/2, as the chopping signals Phase1 and Phase2 but in phase with them. (The four clock signals are referenced to or derived from an internal clock signal.) For the purpose of producing the simulated curve B shown in subsequently described FIG. 4, compensation capacitors C3a and C2a are assumed to have a capacitance of 1 picofarad, compensation capacitors C3b and C2b are assumed to have a capacitance of 6 picofarads, and compensation capacitor C1 is assumed to have a capacitance of 7 picofarads. Capacitor C4 is assumed to have a capacitance of 16 picofarads, and "integrate and transfer" capacitors C5 and C6 are assumed to each have a capacitance of 8 picofarads.

Operational amplifier 1C has two signal paths, including a three-stage high gain signal path through operational transconductance amplifiers 2, 3 and 4 and a two-stage wideband width signal path through operational transconductance amplifiers 5 and 4.

In notch filter input conductors 14A and 14B there are currents from transconductance stage 2, and the net current through conductors 14A and 14B is integrated during one of Phase1 and Phase2 onto integrate and transfer capacitor C5, and during the other phase the net current is integrated onto the other integrate and transfer capacitor C6. This results in all of the signal charge being available on integrate and transfer capacitors C5 and C6, and all of the signal charge is available for redistribution to the next stage, i.e. to the capacitance coupled to notch filter output conductors 22A and 22B. This is advantageous because any loss of signal charge may result in loss of signal information and hence reduced signal-to-noise ratio. Loss of signal charge also tends to produce offset voltages, and may also cause aliasing of noise.

For example, the net input current into notch filter input conductors 14A and 14B is integrated onto integrate and transfer capacitor C5 during Phase1, and then during Phase2 the net notch filter input current is integrated onto integrate and transfer capacitor C6 while the charge on integrate and transfer capacitor C5 is simultaneously redistributed onto capacitance (including capacitor C4) coupled to notch filter output conductors 22A and 22B. With integrate and transfer capacitor C5 coupled to capacitor C4, a redistribution (rather than a complete voltage transfer) of the integrated signal charge is achieved, and over multiple cycles the capacitance (including capacitor C4) coupled to notch filter output conductors 22A and 22B is charged to the correct signal voltage.

Consider a positive offset current representing the actual offset voltage flowing in conductor 14A from operational transconductance amplifier 2 during Phase1, and also an equal and opposite negative offset current (also representing the actual offset voltage) flowing in conductor 14A during Phase2 as a result of the chopping of the input offset voltage of operational transconductance amplifier 2 by chopping circuits 9 and 10. The input offset signal represented by the equal and opposite offset currents is nulled by integrating half of the positive Phase1 offset current and half of the negative Phase2 offset current into integrate and transfer capacitor C5 during the overlap of Phase3 with Phase1 and Phase2 to produce a net "offset voltage" charge component of zero, before transferring the amplified signal being integrated to operational transconductance amplifier 3 during Phase4. Similarly, during Phase4, integrate and transfer capacitor C6 is used to integrate the equal and opposite offset currents which result from chopping the input and output of operational transconductance amplifier 2 to also produce a net "offset voltage" charge component of zero. The integrate and transfer capacitors C5 and C6 operate in tandem during Phase3 and Phase4 as shown by the timing diagram in FIG. 3B to integrate and transfer the net chopped current (including the net zero "offset voltage" charge component) from operational transconductance amplifier 2 to operational transconductance amplifier 3.

More specifically, in the operation of notch filter 15 one signal path integrates the amplified and chopped signal (including the ripple current resulting from the offset voltage) from operational transconductance amplifier 2 on the integrate and transfer capacitor C5 during one half of the notch filter switching cycle. During the same interval the other signal path "transfers" the amplified signal (including the ripple current resulting from the offset voltage) from integrate and transfer capacitor C6 to operational transconductance amplifier 3. During the next half cycle of operation of notch filter 15, the integrate and transfer functions of the two signal paths are reversed. The frequency response of notch filter 15 includes notches at the chopping frequency spectrum values of fs and its harmonics, so the notches suppress the ripple voltages that usually occur in a conventional chopper-stabilized amplifier.

The amplitude of the ripple voltage as it appears at the input of notch filter 15 is related to the size of integrate and transfer capacitors C5 and C6 and also to the chopping frequency fs. Using notch filter 15 to integrate the current produces a triangle voltage waveform at its input. The internal ripple voltage must be sufficiently low to maintain linear operation of the circuitry. If the internal ripple voltage is high enough to cause unsymmetrical operating characteristics, this can cause an increase in the output ripple voltage and offset voltage of the operational amplifier.

If the capacitances of integrate and transfer capacitors C5 and C6 are increased, the ripple voltage amplitude decreases. Also, if the chopping frequency fs is increased, the ripple voltage amplitude decreases. Therefore, to achieve small ripple voltage, there is a trade-off between chopping frequency and the sizes of the capacitors C5 and C6 in notch filter 15. Capacitor C4 and the compensation capacitors coupled to notch filter output conductors 22A and 22B cause a continuous-time filtering effect on the output of notch filter 15, and increasing the capacitances of capacitor C4 and the compensation capacitors generally reduces the magnitude of the high-frequency effects at notch filter output conductors 22A and 22B. The chopping frequency fs should be high enough that smaller notch filter capacitors C4, C5, and C6 can be used, and the chopping frequency should be low enough to allow acceptable settling of the amplified signal. If the chopping frequency is too high, settling of the amplified signal may be too slow, and the gain of input operational transconductance amplifier 2 may be too low, in which case the offset voltage of the "feedforward" operational transconductance amplifier 5 becomes dominant.

Figure 2A:
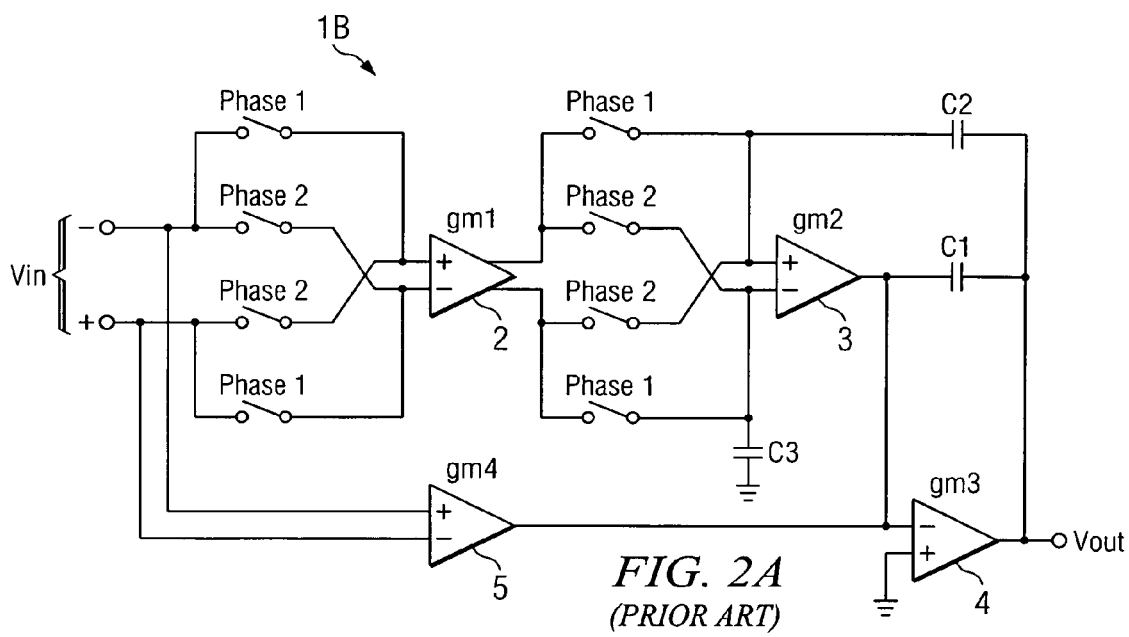
FIG. 2A is a block diagram of a prior art operational amplifier as in FIG. 1 and further including chopper stabilization.
Figure 2B:
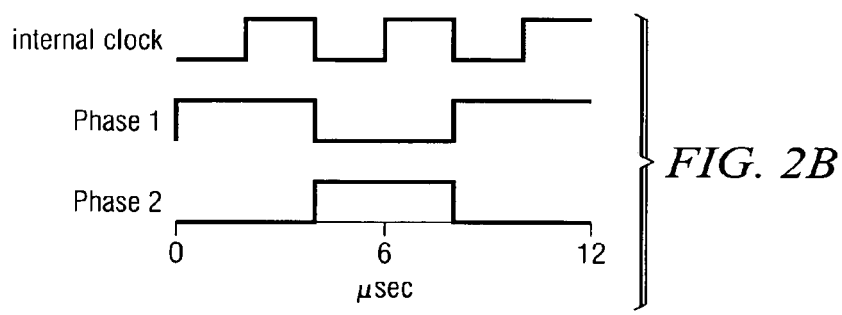
FIG. 2B is a timing diagram for the chopper-stabilized operational amplifier of FIG. 2A.

The output ripple voltage produced by the prior art operational amplifier 1B of FIG. 2A is nearly eliminated in operational amplifier 1C of FIG. 3A by operating switched capacitor notch filter 15 synchronously with the chopping frequency fs to integrate and transfer the chopped output 14A, 14B of operational transconductance amplifier 2 to operational transconductance amplifier 3.

When notch filter 15 is used as shown in FIG. 3A and various design parameters are suitably selected, the ripple voltage component of Vout is greatly reduced, and for some compensation schemes the offset voltage of operational amplifier 1C may be further reduced due to better signal settling. (For example, in one experimental implementation of the invention a 5 millivolt offset voltage was reduced to approximately 2 microvolts, rather than the 5 microvolts that would have been expected from the prior art.) In operational amplifier 1C shown in FIG. 3A, a chopping frequency of 125 kHz can be used to achieve a small ripple voltage with use of reasonably small values of capacitors in notch filter 15.

Although switched capacitor notch filter 15 provides a deep notch which attenuates the output ripple noise at the chopping frequency fs, notch filter 15 also creates a concern for the normal signal transfer because the "integrate and transfer" operation of notch filter 15 causes a signal delay which affects the frequency response of operational amplifier 1C differently for different compensation capacitance configurations. Compensation capacitor C2 of prior art FIG. 2A can be considered to have been split into compensation capacitors C2a and C2b of FIG. 3A and compensation capacitor C3 of FIG. 2A can be considered to have been split into compensation capacitors C3a and C3b of FIG. 3B. The "b" portion of each split compensation capacitor "returns" capacitive compensation to the input of notch filter 15 and the "a" portion "returns" capacitive compensation to the output of notch filter 15. Returning capacitive compensation to the input of notch filter 15 through compensation capacitor C2b has the advantage of providing a "continuous time path" for the normal signal being amplified, but the possibility of causing local loop instability arises due to the above-mentioned signal delay of switched capacitor notch filter 15 being in the local feedback path through compensation capacitor C2b.

To summarize, returning the compensation to the output of notch filter 15 through compensation capacitor C2a provides a direct feedback path to improve local loop stability, but the normal amplified signal being delayed by switched capacitor notch filter 15 may distort the large signal response of operational amplifier 1C. The total of 7 picofarads of Miller capacitive compensation for the compensation capacitors C1, C2, and C3 of operational amplifier 1B of prior art FIG. 2A is maintained in operational amplifier 1C of FIG. 3A for overall amplifier stability. In FIG. 3A, most of the capacitive compensation C2b and C3b (6 pf in this case) is fed back to the input of notch filter 15 to provide good overall signal settling, and a small portion of the capacitive compensation C2a and C3a (1 pf in this case) is fed back to the output of notch filter 15 to maintain good local loop stability. The additional capacitance C4 may be added after the output of notch filter 15 to further reduce unwanted ripple and noise and in some cases to improve overall frequency compensation.

It should be noted that the described embodiments of the present invention never lose signal charge in the signal path. The embodiments of the present invention wherein the notch filter switching is out of phase by 90 degrees as shown in FIG. 3B allows notch filter 15 to be operated at twice the frequency (i.e., at the chopping frequency fs) that is required (i.e., fs/2) if the "up" integration and "down" integration are performed over a complete chopping cycle, e.g., as shown in FIG. 3C. This is because when the Phase3 and Phase4 signals of FIG. 3B are used the delay through the notch filter 15 is decreased by half compared to the delay when the Phase3 and Phase4 signals of FIG. 3C are used.

Figure 4:
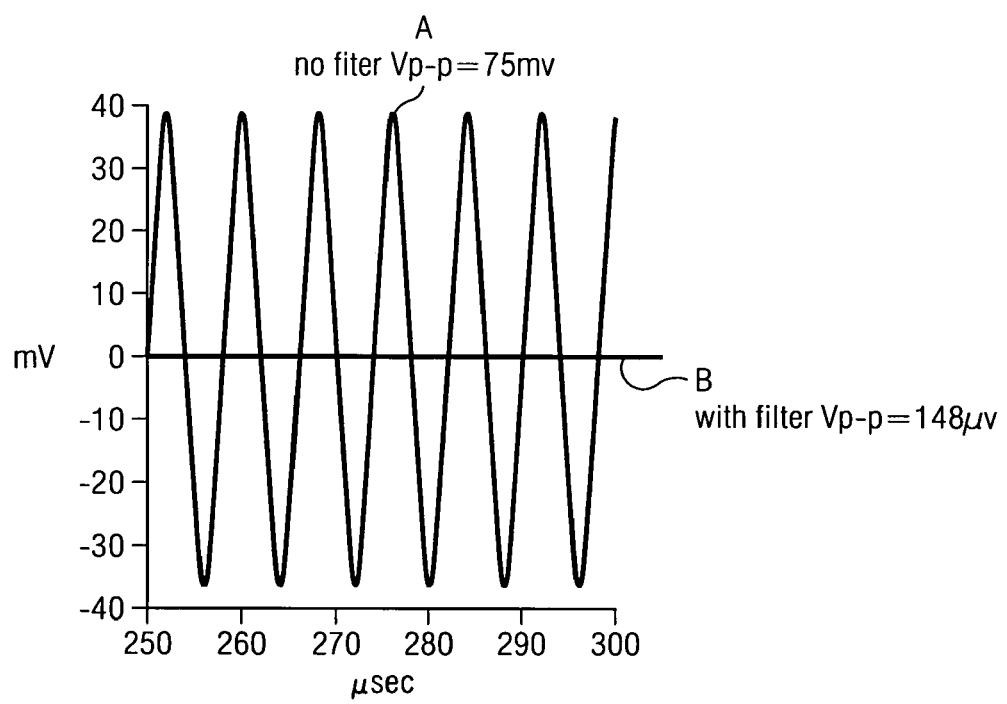
FIG. 4 shows a waveform of the high magnitude ripple noise produced by the operational amplifier of Prior Art FIG. 2A and the negligible ripple noise produced by the amplifier of FIG. 3A.

FIG. 4 shows a simulated output ripple voltage curve A produced by conventional chopper-stabilized operational amplifier 1B of FIG. 2A having a simulated 10 millivolt input offset voltage for operational transconductance amplifier 2 with operational amplifier 1B being configured with a closed loop gain of 10. Curve B of FIG. 4 shows the corresponding, but greatly reduced, output ripple voltage of operational amplifier 1C of FIG. 3A under the same conditions (i.e., offset voltage of 10 millivolts and closed loop gain of 10). Curve B of FIG. 4 indicates a 500× reduction in output ripple voltage for operational amplifier 1C of the present invention compared to the output ripple voltage of curve A for prior art chopper-stabilized operational amplifier 1B. In one implementation of the circuit shown in FIG. 3A, a chopping frequency of 125 kHz was used for an overall gain-bandwidth product of 350 kHz. The gain-bandwidth product relates to the overall compensation of operational amplifier 1C wherein the chopping frequency is 125 kHz, correlating to the axis indicia on FIG. 4. This configuration yielded an offset voltage of 2 microvolts and 0.02 microvolts drift per degree Centigrade. The overall quiescent current was 15 microamperes, and the broad band noise spectrum is 55 nanovolts per $(Hertz)_{1/2}$.

If the clock signals of FIG. 3C are used wherein there is twice the delay through notch filter 15, each integrate and transfer phase of operation of notch filter 15 has to include an integer number of cycles of the chopping frequency fs. What that means is since there are two phases to combine the frequency, notch filter 15 needs to be operated at fs/2, or (fs/2)/2, (fs/3/2), etc.

In order to obtain the notches, notch filter 15 can operate at the chopping frequency fs, staggered by 90 degrees with respect to the chopping frequency as shown in FIG. 3B, or at fs/2 as shown in FIG. 3C or one half of any subharmonic of fs (i.e., fs/4, fs/6 etc.). Either a full cycle of the chopping must be included in the integrate phase, or half the cycle of one chopping phase and half the cycle of the other chopping phase must be included in the integrate cycle in order to get the notches.

Thus, the present invention provides a chopper stabilized operational amplifier using a switched capacitor notch filter with synchronous integration in a continuous time signal path to reduce chopping noise well below the total rms noise of the operational amplifier. The operational amplifier maintains the benefits of chopper stabilization while attenuating the ripple voltage at the chopping frequency fs. The invention thereby provides a chopper-stabilized operational amplifier having substantially reduced output ripple voltage compared to conventional chopper-stabilized amplifiers. This is achieved with no increase in quiescent amplifier current Iq due to the notch filter. The invention is particularly advantageous in micropower integrated circuit applications and/or low noise applications.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, it should be understood that there are other ways to configure the frequency compensation capacitance. The entire compensation capacitance can be connected to the input side of notch filter 15, to the output side thereof, or the compensation capacitance can be "split" in other ways. The effect of various capacitive compensation configurations has been simulated, and in each case the ripple voltage was significantly reduced, and each had different trade-offs between Vout signal settling and stability in the general chopper-stabilized, notch filtered operational amplifier configuration shown in FIG. 3A.

What is claimed is:

1. A chopper-stabilized amplifier comprising:
    (a) a first operational transconductance amplifier;
    (b) first chopper circuitry coupled to an input of the first operational transconductance amplifier for chopping an input signal and applying the chopped input signal to the input of the first operational transconductance amplifier, and second chopper circuitry coupled to an output of the first operational transconductance amplifier for chopping an output signal produced by the first operational transconductance amplifier; and
    (c) a switched capacitor notch filter having an input coupled to an output of the second chopper circuitry and performing an integrate and transfer function on a chopped output signal produced by the second chopper circuitry to filter a chopped output signal produced by the second chopper circuitry by operating synchronously with a chopping frequency of the second chopper circuitry to notch filter ripple voltages that otherwise would occur in the output of the second chopper circuitry.

2. The chopper-stabilized amplifier of claim 1 wherein switching of the switched capacitor notch filter is 90 degrees out of phase with the chopping of the output signal produced by the first operational transconductance amplifier.

3. The chopper-stabilized amplifier of claim 1 wherein the integrate and transfer function is performed without loss of signal charge.

4. The chopper-stabilized amplifier of claim 1 including a second operational transconductance amplifier having an input coupled to an output of the notch filter.

5. The chopper-stabilized amplifier of claim 1 wherein the input of the notch filter includes first and second input terminals, wherein the notch filter includes first and second output terminals, and wherein the notch filter includes
    i. a first path including a first switch coupled between the first input terminal and a first conductor, a second switch coupled between the first conductor and the first output terminal, a third switch coupled between the second input terminal and a second conductor, and a fourth switch coupled between the second conductor and the second output terminal,
    ii. a second path including a fifth switch coupled between the first input terminal and a third conductor, a sixth switch coupled between the third conductor and the first output terminal, a seventh switch coupled between the second input terminal and a fourth conductor, and an eighth switch coupled between the fourth conductor and the second output terminal, and
    iii. a first integrate and transfer capacitor coupled between the first and second conductors and a second integrate and transfer capacitor coupled between the third and fourth conductors.

6. The chopper-stabilized amplifier of claim 5 wherein the first, third, sixth and eighth switches are controlled by a first clock signal and the second, fourth, fifth, and seventh switches are controlled by a second clock signal, wherein the first and second clock signals are out of phase with each other.

7. The chopper-stabilized amplifier of claim 6 wherein transitions of the first and second clock signals are shifted with respect to transitions of a chopping signal of the second chopper circuitry.

8. The chopper-stabilized amplifier of claim 7 wherein transitions of the first and second clock signals are shifted by 90 degrees with respect to transitions of a chopping signal of the second chopper circuitry.

9. The chopper-stabilized amplifier of claim 1 wherein the notch filter operates synchronously with a chopping signal of the second chopper circuitry to cause a charge at the input of the notch filter to be integrated onto a first integrate and transfer capacitor during the first clock signal and onto the second integrate and transfer capacitor during the second clock signal and to cause the charge held on the first integrate and transfer capacitor to be transferred to the output of the notch filter during the second clock signal and to cause the charge held on the second integrate and transfer capacitor to be transferred to the output of the notch filter during the first clock signal.

10. The chopper-stabilized amplifier of claim 1 wherein the notch filter operates at the same or lower frequency than the chopping frequency.

11. The chopper-stabilized amplifier of claim 4 including a third operational transconductance amplifier having an input coupled to an output of the second operational transconductance amplifier, and a fourth operational transconductance amplifier having an input coupled to receive the input signal and an output coupled to the output of the second operational transconductance amplifier.

12. The chopper-stabilized amplifier of claim 4 including an operational amplifier having an input coupled to an output of the second operational transconductance amplifier, and a third operational transconductance amplifier having an input coupled to receive the input signal and an output coupled to the output of the second operational transconductance amplifier.

13. The chopper-stabilized amplifier of claim 11 including compensation capacitance coupled on the input side of the notch filter and the output side of the notch filter.

14. The chopper-stabilized amplifier of claim 13 wherein the amount of compensation capacitance coupled on the input side of the notch filter is substantially greater than the amount of compensation capacitance coupled on the output side of the notch filter to provide stability and fast signal settling in the chopper-stabilized amplifier.

15. The chopper-stabilized amplifier of claim 11 wherein no compensation capacitor is coupled to the output of the notch filter.

16. The chopper-stabilized amplifier of claim 11 wherein no compensation capacitor is coupled to the input of the notch filter.

17. A method of operating a chopper-stabilized amplifier including a first operational transconductance amplifier, the method comprising:

(a) chopping an input signal and applying the chopped input signal to the input of the first operational transconductance amplifier, and chopping an output signal produced by the first operational transconductance amplifier at a chopping frequency to produce a chopped output signal; and (b) operating a switched capacitor notch filter having an input coupled to receive the chopped output signal by performing an integrate and transfer function on a chopped output signal produced by the second chopper circuitry synchronously with the chopping frequency to notch filter ripple voltages that otherwise would occur in the chopped output signal.

18. The method of claim 17 wherein switching of the switched capacitor notch filter is 90 degrees out of phase with the chopping of the output signal produced by the first operational transconductance amplifier.

19. The method of claim 17 including performing the integrate and transfer function without loss of signal charge.

20. A chopper-stabilized amplifier comprising:

(a) a first operational transconductance amplifier;

(b) first chopper circuitry coupled to an input of the first operational transconductance amplifier for chopping an input signal and applying the chopped input signal to the input of the first operational transconductance amplifier, and second chopper circuitry coupled to an output of the first operational transconductance amplifier for chopping an output signal produced by the first operational transconductance amplifier; and (c) switched capacitor notch filter means having an input coupled to receive the chopped output signal for performing an integrate and transfer function on a chopped output signal produced by the second chopper circuitry synchronously with the chopping frequency to notch filter ripple voltages that otherwise would occur in the chopped output signal.

* * * * *

(12) EX PARTE REEXAMINATION CERTIFICATE (8756th)
United States Patent
Burt et al.

(10) Number: US 7,292,095 C1
(45) Certificate Issued: Dec. 13, 2011

(54) NOTCH FILTER FOR RIPPLE REDUCTION IN CHOPPER STABILIZED AMPLIFIERS

(75) Inventors: Rodney T. Burt, Tucson, AZ (US); Joy Y. Zhang, Tucson, AZ (US)

(73) Assignee: Texas Instruments Incorporated, Dallas, TX (US)

Reexamination Request:
No. 90/011,698, Jun. 17, 2011

Reexamination Certificate for:
Patent No.: 7,292,095
Issued: Nov. 6, 2007
Appl. No.: 11/340,223
Filed: Jan. 26, 2006

(51) Int. Cl.
*H03F 1/02* (2006.01)

(52) U.S. Cl. ............................................. 330/9; 330/69
(58) Field of Classification Search .................. None
See application file for complete search history.

(56) References Cited

To view the complete listing of prior art documents cited during the proceeding for Reexamination Control Number 90/011,698, please refer to the USPTO's public Patent Application Information Retrieval (PAIR) system under the Display References tab.

*Primary Examiner* — Margaret Rubin

(57) ABSTRACT

A chopper-stabilized amplifier receiving an input signal includes a first operational transconductance amplifier having an input chopper and an output chopper for chopping an output signal produced by the first operational transconductance amplifier. A switched capacitor notch filter filters the chopped output signal by operating synchronously with the chopping frequency of output chopper to filter ripple voltages that otherwise would be produced by the output chopper. In one embodiment, a second operational transconductance amplifier amplifies the notch filter output. The input signal is fed forward, summed with the output of the second operational transconductance amplifier, and applied to the input of a fourth operational transconductance amplifier. Ripple noise and offset are substantially reduced.

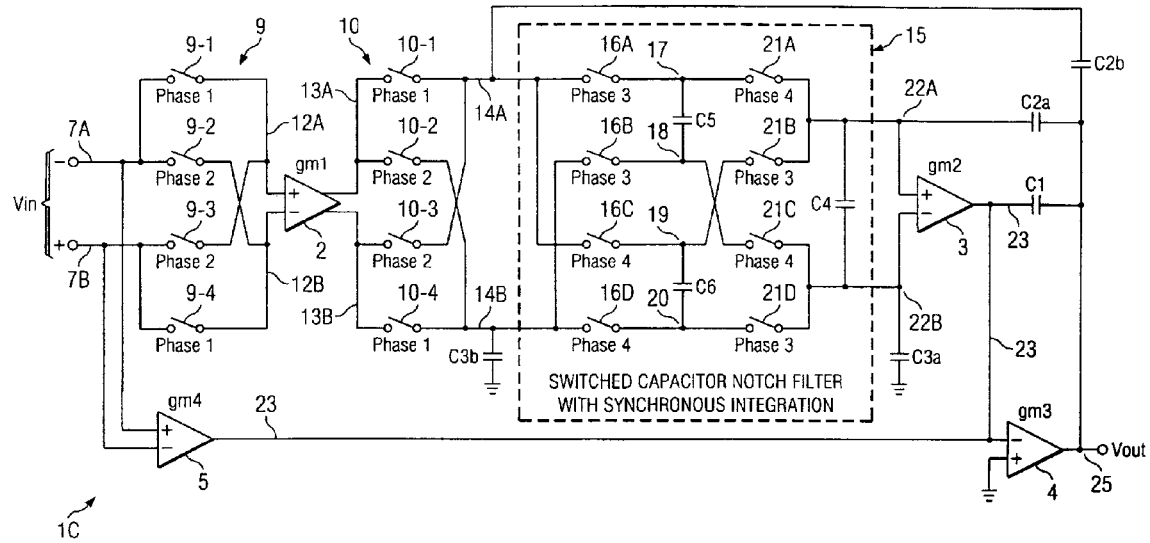

＃ EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 5, 18 and 20 are cancelled.

Claims 1 and 17 are determined to be patentable as amended.

Claims 4 and 10-16, dependent on an amended claim, are determined to be patentable.

New claims 21-25 are added and determined to be patentable.

Claims 2, 3, 5-9 and 19 were not reexamined.

1. A chopper-stabilized amplifier comprising:
[(a)] a first operational transconductance amplifier;
[(b)] first chopper circuitry coupled to an input of the first operational transconductance amplifier for chopping an input signal and applying the chopped input signal to the input of the first operational transconductance amplifier[, and];
second chopper circuitry coupled to an output of the first operational transconductance amplifier for chopping an output signal produced by the first operational transconductance amplifier; and
[(c)] a switched capacitor notch filter having an input coupled to an output of the second chopper circuitry and performing an integrate and transfer function on a chopped output signal produced by the second chopper circuitry to filter a chopped output signal produced by the second chopper circuitry by operating synchronously with a chopping frequency of the second chopper circuitry to notch filter ripple voltages that otherwise would occur in the output of the second chopper circuitry, *wherein the input of the notch filter includes first and second input terminals, and wherein the notch filter includes first and second output terminals, and wherein the notch filter includes:*
*a first path including a first switch coupled between the first input terminal and a first conductor, a second switch coupled between the first conductor and the first output terminal, a third switch coupled between the second input terminal and a second conductor, and a fourth switch coupled between the second conductor and the second output terminal;*
*a second path including a fifth switch coupled between the first input terminal and a third conductor, a sixth switch coupled between the third conductor and the first output terminal, a seventh switch coupled between the second input terminal and a fourth conductor, and an eighth switch coupled between the fourth conductor and the second output terminal;*
*a first integrate and transfer capacitor coupled between the first and second conductors; and*
*a second integrate and transfer capacitor coupled between the third and fourth conductors.*

17. A method of operating a chopper-stabilized amplifier including a first operational transconductance amplifier, the method comprising:
[(a)] chopping an input signal and applying the chopped input signal to the input of the first operational transconductance amplifier[, and];
chopping an output signal produced by the first operational transconductance amplifier at a chopping frequency to produce a chopped output signal; and
[(b)] operating a switched capacitor notch filter having an input coupled to receive the chopped output signal by performing an integrate and transfer function on a chopped output signal produced by the second chopper circuitry synchronously with the chopping frequency to notch filter ripple voltages that otherwise would occur in the chopped output signal, *wherein switching of the switched capacitor notch filter is 90 degrees out of phase with the chopping of the output signal produced by the first operational transconductance amplifier.*

*21. A chopper-stabilized amplifier comprising:*
*a first oprational transconductance amplifier;*
*first chopper circuitry coupled to an input of the first operational transconductance amplifier for chopping an input signal and applying the chopped input signal to the input of the first operational transconductance amplifier;*
*second chopper circuitry coupled to an output of the first operational transconductance amplifier for chopping an output signal produced by the first operational transconductance amplifier; and*
*a switched capacitor notch filter having an input coupled to an output of the second chopper circuitry and performing an integrate and transfer function on a chopped output signal produced by the second chopper circuitry to filter a chopper output signal produced by the second chopper circuitry by operating synchronously with a chopping frequency of the second chopper circuitry to notch filter ripple voltages that otherwise would occur in the output of the second chopper circuitry, wherein the switching of the switched capacitor notch filter is 90 degrees out of phase with the chopping of the output signal produced by the first operational transconductance amplifier.*

*22. The chopper-stabilized amplifier of claim 21 including a second operational transconductance amplifier having an input coupled to an output of the notch filter.*

*23. The chopper-stabilized amplifier of claim 22 including a third operational transconductance amplifier having an input coupled to an output of the second operational transconductance amplifier, and a fourth operational transconductance amplifier having an input coupled to receive the input signal and an output coupled to the output of the second operational transconductance amplifier.*

*24. The chopper-stabilized amplifier of claim 23 including compensation capacitance coupled on the input side of the notch filter and the output side of the notch filter.*

*25. The chopper-stabilized amplifier of claim 24 wherein the amount of compensation capacitance coupled on the input side of the notch filter is substantially greater than the amount of compensation capacitance coupled on the output side of the notch filter provide stability and fast signal settling in the chopper-stabilized amplifier.*

* * * * *